(12) United States Patent
Havenith et al.

(10) Patent No.: US 6,441,072 B1
(45) Date of Patent: Aug. 27, 2002

(54) HIGH-MELTING POLYAMIDE COMPOSITION FOR ELECTRONIC APPLICATIONS

(75) Inventors: Hubertus G. J. Havenith, Kerkrade; Wilhelmus J. M. Sour, Maastricht; Johannes Tijssen, Spaubeek; Robert M. Leeuwendal, Guilford, all of (NL)

(73) Assignee: DSM N.V., Heerlen (NL)

(*) Notice: Subject to any disclaimer, the term of this patent is extended or adjusted under 35 U.S.C. 154(b) by 275 days.

(21) Appl. No.: 09/654,472

(22) Filed: Sep. 1, 2000

Related U.S. Application Data

(63) Continuation of application No. PCT/NL99/00109, filed on Mar. 2, 1999.

(30) Foreign Application Priority Data

Mar. 2, 1998 (NL) .............................................. 1008443

(51) Int. Cl.[7] .......................... C08J 3/10; C08F 283/04
(52) U.S. Cl. ...................... 524/412; 528/332; 528/335; 528/338; 525/420; 525/422; 525/425; 525/432; 524/174; 524/177; 524/411; 524/430; 524/442
(58) Field of Search ................................. 528/332, 335, 528/338; 525/420, 422, 425, 432; 524/174, 177, 411, 412, 430, 442

(56) References Cited

U.S. PATENT DOCUMENTS

| | | | | | |
|---|---|---|---|---|---|
| 5,194,481 A | * | 3/1993 | Takagi et al. | ................ | 524/410 |
| 5,256,718 A | * | 10/1993 | Yamamoto et al. | .......... | 524/411 |
| 5,773,500 A | * | 6/1998 | Reichmann | .................. | 524/410 |
| 5,852,165 A | * | 12/1998 | Tsumiyama et al. | ........ | 528/332 |
| 5,863,974 A | * | 1/1999 | Tjahjadi et al. | .............. | 524/412 |

FOREIGN PATENT DOCUMENTS

| | | |
|---|---|---|
| EP | 0172259 | 2/1986 |
| EP | 0481558 | 4/1992 |
| WO | WO9625463 | 4/1996 |

\* cited by examiner

*Primary Examiner*—Samuel A. Acquah
(74) *Attorney, Agent, or Firm*—Pillsbury Winthrop, LLP

(57) ABSTRACT

The invention relates to a polyamide composition for the production of electrical and electronic components that are suitable for the conditions of the surface mounting technology. In particular, the composition exhibits a high resistance to blistering during the reflow soldering process. The composition according to the invention comprises (a) a polyamide having a melting point higher than 280° C., (b) a polymer having a melting point lower than 230° C., (c) a halogen-containing compound, (d) optionally a synergist for the flame-retardant properties (e) reinforcing material (f) optionally other additives. A particularly good resistance to blistering is achieved if (f) contains at least a compound with acid imide groups.

17 Claims, 2 Drawing Sheets

HIGH-MELTING POLYAMIDE COMPOSITION FOR ELECTRONIC APPLICATIONS

Figure 1:
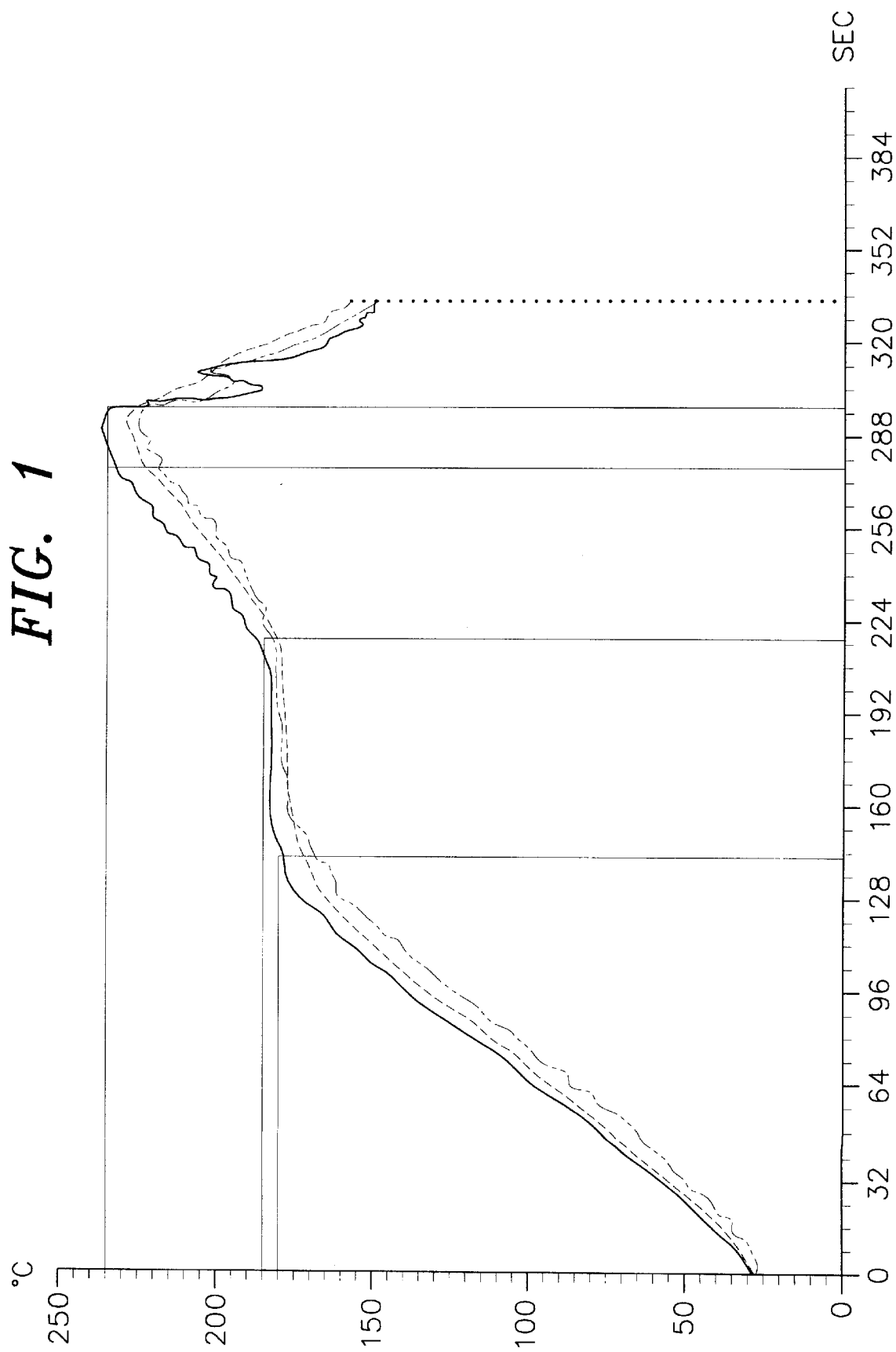

This is a Continuation of International Appln. No. PCT/NL99/00109 filed Mar. 2, 1999 which designated the U.S.

The invention relates to a polyamide composition that is particularly suitable for the production of electrical and electronic components used in the so-called surface mounting technology, SMT, for printed circuits, which involves their being exposed to very high temperatures during the so-called reflow soldering process. The high temperatures used are obtained by, inter alia, infra-red radiation or hot-air circulation or a combination of both.

It goes without saying that the mechanical integrity of the component is to be retained at the high temperatures, which may increase to over 260° C. There are various reasons for the use of high-melting polyamide compositions in SMT components.

These compositions generally contain fibre-reinforcing materials, often glass fibre and materials promoting flame retardancy.

In view of the very high processing temperatures, 300° C. and higher, needed for the production of the SMT components from the high-melting polyamides, high demands are to be met in terms of the chemical stability of the flame retardants used and in particular flame retardants are suitable whose activity is based on incorporated halogen. Bromine-containing styrene polymers are very often applied.

In practice, in particular under tropical conditions, a disturbing phenomenon, blister formation on the surface of the soldered components, occurs when SMT components from the high-melting polyamides are reflow soldered. This phenomenon is ascribed to the fact that polyamides readily absorb water, which absorbed water will expand explosively in the component when the latter's temperature is raised in a very short time, for instance by means of infrared radiation, to for instance 260° C. Much research has therefore been aimed at reduction of the water absorption. JP-A-63-1959508, for instance, recommends drying the components to a water content of less than 0.8 wt. % before mounting them on the printed circuit board. This, however, necessitates an extra action and special logistics, while there must only be a short time between drying and mounting of the component. Factors interfering with the mounting process have a highly adverse effect.

Attempts have also been made, through incorporation of apolar polymers, or polymers having a low water absorption capacity, to reduce the water absorption capacity of the composition used, in particular of the aliphatic polyamide-4.6. To this end use has been made of, inter alia, aromatic polyesters, for instance polybutylene terephthalate, JP-A-03-190962, amorphous aliphatic polyamides with a long carbon chain, for instance polyamide-12, amorphous aromatic polyamides; for instance polyamide-6.6/6.T, JP-A-06-065502, and an aromatic polysulphone, JP-A-05-239344. In addition to sometimes negative effects on the mechanical properties of the components produced from these compositions, none of the compositions obtained proved to be an adequate solution to the blistering problem under all production conditions.

In particular under tropical conditions, 90% relative humidity and 35° C., in a number of cases blistering is still found to occur, even though the water absorption capacity of the compositions has been reduced strongly.

The aim of the invention is a polyamide composition for use in electrical and electronic components suitable for SMT that exhibit an even greater resistance to blistering during the infrared or hot-air circulation reflow soldering process. The invention is aimed in particular at a polyamide composition which, in spite of a water content higher than 0.8 wt. %, does not give rise to blistering if processed in electrical and electronic components in the said reflow soldering processes.

This aim is achieved with a composition comprising
(a) a polyamide having a melting point of at least about 280° C.
(b) a thermoplastic polymer having a melting point of lower than 230° C.
(c) a halogen-containing organic compound which, when heated at 300° C. for 10 minutes, generates at most 200 ppm, preferably at most 50 ppm, inorganic chlorine and at most 350 ppm, preferably at most 300 ppm, inorganic bromine.
(d) optionally a compound supporting the flame-retarding activity of (c)
(e) an inorganic reinforcement
(f) optionally other additives The polyamide (a) may be either a homopolyamide or a copolyamide and be composed of repeating units derived from a diamine and a dicarboxylic acid or have been obtained by ring opening of a lactam.

Suitable diamines are aliphatic diamines, cycloaliphatic diamines and aromatic diamines. Examples are tetramethylene diamine, hexamethylene diamine, 2-methylpentamethylene diamine (2MP), 1,4-cyclohexane diamine (CHDA), 1,4-phenylene diamine (PDA) and p.xylylene diamine (PXDA). Suitable dicarboxylic acids are aliphatic, cycloaliphatic and aromatic dicarboxylic acids. Examples are adipic acid, pimelic acid, 1,4-cyclohexane dicarboxylic acid (CHDC), terephthalic acid (T) and isophthalic acid (I). Suitable homopolyamides and copolyamides include polyamide 4.6, polyamide-4.T, polyamide-4.6/4.T, polyamide-6.6/6.CHDC, polyamide-6.6/6.T, polyamide-6/6.6/6T and polyamide-6T/6I/2MPT. Several of these polyamides are commercially available under different trademarks. The polyamides can be obtained by means of polycondensation starting from the monomeric components or the corresponding nylon salts. These processes, which are known to one skilled in the art, are described in, inter alia, Encyclopaedia of polymer science and engineering, Vol. 11. p. 315 ff. (1988), ISBN 0-471-80943-8 (v.11) and the references quoted there.

Preferably, a polyamide with a melting point between 280° C. and 340° C. is chosen. At a higher temperature the stability of the constituent components is generally insufficient and processing by means of, inter alia, injection moulding presents technical problems.

Preferably, the melting point lies between 280 and 320° C. Both the blistering behaviour and the mechanical properties are favourably affected by a higher molecular weight of the polyamide. One skilled in the art will aim to use a polyamide with the highest possible degree of polymerization that can still readily be processed.

For the thermoplastic polymer (b) in principle any polymer having a melting point below 230° C. can be chosen. However, to retain the good physical properties of the composition, preference is given to a polymer that is at least to some degree compatible with polyamide (a). For this reason, polyolefins, for instance, are less suitable for use as polymer (b), but when the polyolefin is modified, for instance through grafting with maleic anhydride, so that polar groups are introduced that improve the compatibility with polyamide, polyolefins can be applied. The same holds for other apolar polymers that, through modification with inter alia carboxylic acid, amine and epoxy groups, are better compatible with polyamide. Preferably, the melting point is lower than 220° C., even more preferably lower than 200° C.

Particularly suitable are polyesters, copolyesters and polyamides. Examples of esters are polybutylene terephthalate, polyethylene terephthalate, polycarbonate and copolyether esters, for instance the copolyester derived from polybutylene terephthalate and polytetrahydrofuran. Suitable polyamides are polyamide 6, polyamide 8, polyamide 11 and polyamide 12. Preferably, the ratio of aliphatic C atoms: amide groups in the chain is at least 6, even more preferably at least 8.

Preferably, component (b) is very well dispersed in the matrix of (a). The best effects are obtained if the average cross-section of dispersed particles of component (b) in the composition in the solid state is less than 3 $\mu$m, preferably less than 1 $\mu$m for at least 90% of the particles.

The halogen-containing organic compound (c) is chosen from the group formed by halogen-containing organic compounds that are used as flame retardant for polyamide. The best known from this group are halogen-containing polymers. In view of the high processing temperatures and the complications that may present themselves at these temperatures due to the higher volatility of lower-molecular-weight products, preference is given to the polymeric halogen-containing compounds, of which the bromine-containing ones are the widest available and cause the fewest environmental problems.

At the high processing temperatures lower-molecular-weight halogen-containing compounds generally have a too high vapour pressure and often exhibit bleeding-out. The molecular weight $M_w$ is therefore preferably >25,000, and even more preferably >30,000, while in general the molecular weight will not exceed 100,000 as in that case the processability will become problematic.

The use of halogen-containing polymers, in particular bromine-containing styrene polymers, which upon heating to 300° C. generate at most 50 ppm inorganic chlorine and at most 350 ppm inorganic bromine, is known from JP-A-08-208978. In said patent a similar bromine-containing polystyrene compound is used to prevent the adverse effects of mould degradation and electrical corrosion by the inorganic chlorine or bromine. No mention is made of any positive effect of the low inorganic halide content to be generated on the blistering phenomenon and the combination with polymer (b.

The preparation of bromine-containing polymeric flame retardants suitable for use as component (c) is described, inter alia, in WO-A-91/13915, U.S. Pat. No. 5,369,202 and JP-A-05-287014.

The inorganic chlorine and bromine content generated upon heating to 300° C. can readily be determined by heating a weighed amount of component (c) in a nitrogen flow and passing this nitrogen flow through a diluted solution of hydrogen peroxide (1%) in which the inorganic chlorine and bromine are absorbed and subsequently determined, for instance by means of ion chromatography or another standard technique. In this determination the sample is kept at 300° C. for 10 minutes and is present in finely divided form.

When use is made of a polymer composition with a high processing temperature, it is advantageous for the said maximum amounts of inorganic chlorine and bromine to be generated only when heating at 320° C. takes place, and even more advantageously to be generated only at a temperature of 340° C.

The flame retardancy of the composition can be improved further through the presence of a component (d). In principle this can be any substance that has a synergistic effect with the halogen-containing flame-retardant compounds (c). In view of the very high processing temperatures, preferably inorganic compounds can be used for this. Examples may be metal oxides, for instance antimony oxide and the oxides of alkaline earth metals, metal hydroxides, for instance magnesium hydroxide and aluminium hydroxide, hydroxycarbonates and phosphorus- or boron-containing compounds. Antimony oxide and sodium antimonate are often used.

For the required stiffness the compositions generally contain a reinforcing fibre material, for instance glass fibre. The length and diameter of the reinforcing fibre material may vary within wide limits, the length for instance between 60 and 600$\mu$ and the diameter between 1 and 20$\mu$. Other reinforcing fillers may also be present, for instance reinforcing materials in the shape of platelets, for instance mica, talc and clay. Preferably, these reinforcing materials are present in well-dispersed form.

The composition may further contain the customary additives, for instance stabilizers against the effect of high temperatures, UV light and hydrolysis, processing aids, for instance mould release agents and flow-promoting agents, colourants and pigments and toughness improvers.

Surprisingly, it has been found that an even better blistering resistance is obtained when also a compound containing acid imide groups according to the following formula is present in the composition.

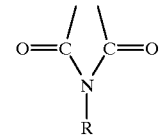

where R is H, or a group chosen from alkyl, aryl, alkaryl or aralkyl with 1 to 12 C atoms.

Examples of such compounds are styrene maleide imide copolymers, polyether imide and imidized polyacrylate. Preference is given to styrene maleide imide (SMI), which is commercially available; for instance Denka SMI® of Denki Ragaku Kogyo K.K., which is prepared by imidization of a styrene maleic acid copolymer (SMA).

Most surprisingly, the positive effect on blistering is not present upon addition of SMA.

A further advantage is that the flame retardancy is improved through addition of the acid imide containing compound so that in total fewer flame-retarding components in the composition suffice, which has a favourable effect on the mechanical properties.

The ratios in which the various components may be present in the composition varies within wide limits and is determined in part by the desired mechanical properties. In general, the composition lies within the following limits, the percentages being expressed as weight percentage relating to the total composition.

20–60 wt. % (a) preferably 23–55 wt. %
1–20 wt. % (b) preferably 2–15 wt. %
5–30 wt. % (c) preferably 8–25 wt. %
0–15 wt. % (d) preferably 2–12 wt. %
5–50 wt. % (e) preferably 10–45 wt. %
0–20 wt. % (f) preferably 0–15 wt. %

When use is made of a composition containing acid imide groups, its content is generally 0.5–20 wt. %, preferably 1–10 wt. %, even more preferably 1–5 wt. %.

The activity of the composition containing acid imide groups depends in part on the acid imide groups content.

The invention will now be elucidated with reference to the following examples and comparative experiments. Evidently, the invention is not limited to these and the various components, in particular (a), (b) and (c), can simply be replaced by substances exhibiting similar properties.

To keep the comparison between the effects of the various additions as strict as possible, in all examples, unless stated otherwise, the same type of glass fibre was used, 0.5 wt. % mould release agent and 0.33 wt. % of a thermal oxidative stabilizer.

After drying of the individual components the compositions were produced on a ZSK 25 twin-screw extruder. The dosing method employed affects the absolute levels of the properties. However, the examples and comparative examples in this application were all carried out in the same way, unless stated otherwise.

Of the composition test bars were produced on an Arburg CMD injection moulding machine, at a melt temperature of 310–350° C., depending on the melting point of the high-melting polyamide.

Materials used:

(a)
1. STANYL® KS 200; low-molecular-weight polyamide-4.6 from DSM, Netherlands
2. KS 300; medium-molecular-weight polyamide-4.6 from DSM
3. AMODEL® AF 1113 from Amoco, USA; aromatic copolyamide 6.6/6.I/6.T
4. AF 4133 from Amoco, USA; aromatic copolyamide 6.6/6.T
5. Arlene® CH 230 from Mitsui, JP; aromatic copolyamide 6.6/6.T
6. Grivory® HTVS-3X2VO from EMS, CH; 6.6/6.T
7. Grivory® HTV -4X2VO; 6.6/6.T (b)
4. polyethersulphone; Victrex® 3600 from ICI, UK, $t_g$=179° C.

(c)
1. Pyro-check® 68 PB; brominated polystyrene from Ferro, USA, inorganic Cl=730 ppm and Br=760 ppm at 320° C.
2. PDBS® 80; polydibromostyrene from Great Lakes, USA. Cl=3 ppm and Br=74 ppm (d) $Sb_2O_3$; antimony trioxide (e) glass fibre; diameter 10 $\mu$m, length 3 mm (f) SMI; Denka® SMI MS-NA from Denki Kagaku, Japan The tensile tests were carried out in conformity with ASTM D-638.

The flame retardancy was determined according to the method of US Underwriters Laboratory (UL 94). Thickness of the test bars 0.8 mm.

The water absorption was measured on the basis of the weight increase of the test bars upon exposure to the environment as specified.

A first series of experiments was carried out with the following compositions:

EXAMPLES I–V

Comparative Experiments A–F (see Table 1)

The test bars for the blistering test were conditioned for 1 hour at 80° C. and 95% relative humidity. As a measure of the reflow soldering resistance the temperature was used at which the first blisters are formed on the test plates in a combined hot air—IR reflow soldering unit. To this end the test plate was preheated for 60 seconds at 150° C. and subsequently kept for 20 seconds at the specified temperature. The latter temperature is measured on the surface of the test plates.

TABLE 1

| | Comp. (a) wt. % | Comp. (b) wt. % | Comp. (c) wt. % | Comp. (d) $Sb_2O_3$ wt. % | Comp. (e) glass fibre wt. % | Tensile strength MPa | UL-94 | Water content wt. % | Blistering temp. ° C. |
|---|---|---|---|---|---|---|---|---|---|
| Comparative experiment A | 43.3 (a.2.) | 0.0 | 19.5 (c.1.) | 6.1 | 31.2 | 208 | V-O | 2.4 | 249 |
| Comparative experiment B | 43.3 (a.2.) | 0.0 | 19.5 (c.2.) | 6.1 | 31.2 | 179 | V-O | 2.2 | 252 |
| Comparative experiment C | 30.3 (a.2.) | 13.1 (b.2.) | 19.8 (c.1.) | 6.2 | 30.6 | 168 | V-O | 1.8 | 237 |
| Comparative experiment D | 25.1 (a.2.) | 10.8 (b.2.) | 17.9 (c.1.) | 5.6 | 40.6 | 173 | V-O | 1.5 | 220 |
| Comparative experiment E | 33 (a.2.) | 8 (b.1.) | 19 (c.1.) | 5 | 35 | 194 | V-O | 1.8 | 245 |
| Comparative experiment F | 33 (a.2.) | 8 (b.4.) | 19 (c.1.) | 5 | 35 | 194 | V-O | 1.6 | 245 |
| Example I | 30.3 (a.2.) | 13.1 (b.2) | 19.8 (c.2.) | 6.0 | 30.8 | 140 | V-O | 2.1 | 270 |
| Example II | 30.3 (a.2.) | 13.1 (b.3.) | 19.8 (c.2.) | 6.0 | 30.8 | 139 | V-O | 2.0 | 270 |
| Example III | 25.1 (a.2.) | 10.8 (b.2.) | 18.9 (c.2.) | 5.5 | 39.7 | 162 | V-O | 1.9 | 270 |
| Example IV | 33 (a.2.) | 8 (b.1.) | 19 (c.2.) | 5 | 35 | 190 | V-O | 1.8 | 255 |
| Example V | 33 (a.2.) | 8 (b.4.) | 19 (c.2) | 5 | 35 | | V-O | 1.6 | 255 |

1. polybutylene terephthalate. $t_m$=225≅ C.
2. polyamide-11; Rilsan® B MNO from Elf Atochem, France. $t_m$=185° C.
3. polyamide-12; X-1988 from Hüls, Germany, $t_m$=180° C.

The effects of polyamide-11 and -12 on the blistering behaviour are almost identical in the composition according to the invention. The effect of polybutylene terephthalate and polyethersulphone in combination with the flame retardant (c.2) is, however, relatively small, in spite of the substantial effect on the water absorption.

An explanation may perhaps be found in the much better dispersion of the low-melting polyamides in the high-melting polyamide, as is apparent in electron microscopic pictures of the compositions of examples I and IV. The polyamide-11 phase is dispersed in particles of which at least 90% have a diameter smaller than 3 μm. The polybutylene terephthalate particles have much coarser dimensions.

EXAMPLE VI
Comparative Experiments G and H

Show the advantages of the composition according to the invention for a number of other high-melting copolyamides.

Figure 2:
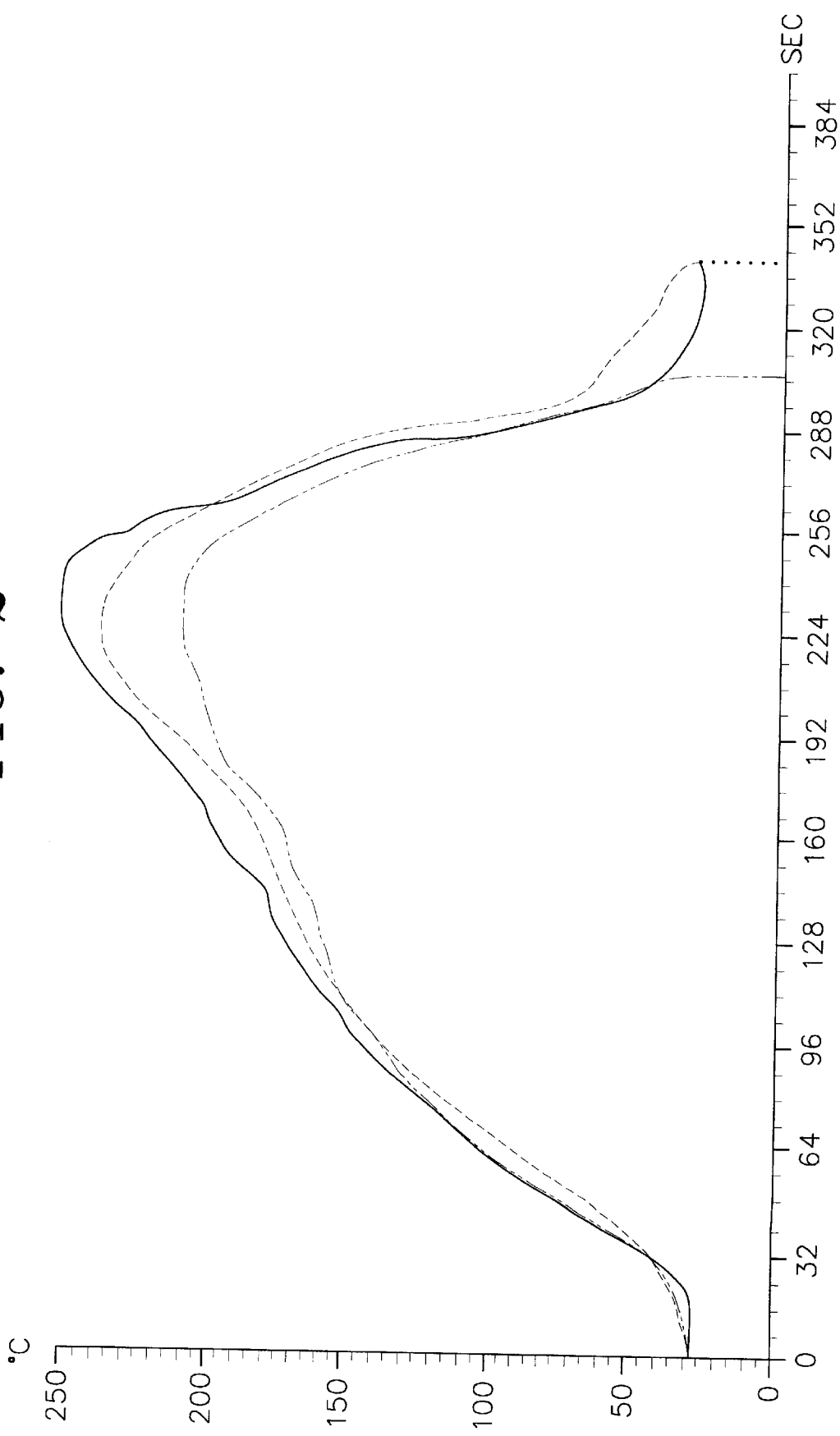

A copolyamide 6.6/6.T with a molar ratio of 0.4:0.6 was synthesized with a relative viscosity of 3.0 (measured in $H_2SO_4$). With this copolyamide the compositions of Example VI and comparative experiment G were produced. After conditioning of the test bars produced with these compositions for different lengths of time, the blistering resistance was determined. The test bars used for the blistering experiments were kept for varying periods at 35° C. and a relative humidity of 90%, after which the blistering was measured under the conditions of IR reflow and those of hot air circulation reflow at different temperatures. FIGS. 1 and 2 give representative temperature profiles for the tests in the hot-air oven and the infrared radiation oven, respectively. The temperature was measured at 3 places on the surface of the test bar. This involved counting of the number of blisters formed per 2 bars. In addition, the water content of a number of test bars was measured after the different conditioning periods. The test bars had a length of 115 mm, a width of 12 mm and a thickness of 0.8 mm.

As comparative experiment H a commercial composition, Amodel AF 1133 VONT, was included. The absorbed water content of these compositions is relatively low, as can be expected on the basis of the aromatic character of the polyamide.

Nevertheless, after 10 days' conditioning the composition in comparative experiment G and the commercial composition in experiment H under the conditions of IR reflow at 260° C. appear to exhibit a considerable degree of blistering, more than 50 blisters being counted per 2 test bars. In experiment G some blistering occurs already after 5 days' conditioning. The composition according to the invention does not show any blistering also after 20 days' conditioning.

The compositions contain 33–35 wt. % glass fibre. In example VI and comparative experiment G also 9 wt. % Polyamide-11 was present.

In example VI PDBS® 80 was used, in the other experiments Pyrocheck® 68PB. The amounts of flame retardant were chosen so that the Br content of the composition was the same in all cases (based on 13.7 wt. % Pyrocheck® 68PB in the composition of comparative experiment H).

EXAMPLES VII and VIII

In the composition of example III a part of the PDBS 80 (comp.(c.2)) was replaced by an imidized SMA, SMI, 2.8 wt. % (example VII). Then test bars were injection moulded from the compositions of example III (now example VIII) and tested for their blistering behaviour in the manner described in example VI and comparative experiments G and H.

The composition of example VII did not show any blistering even after 10 days' conditioning both under hot-air circulation oven conditions and under the infrared radiation conditions at 260° C.

The composition of example III (example VIII) started to blister under IR reflow conditions only after 5 days' conditioning.

In the UL-94 test both compositions met the V-O classifications. The composition of example VII in which SMI was present did not exhibit any dripping, neither after the first nor after the second flame contact. This phenomenon did occur upon the second flame contact of the composition without SMI.

Further tests showed that the total amount of flame retardant needed for realization of a UL-94 V-O classification in the presence of SMI, and including SMI, is smaller than in the absence of SMI.

What is claimed is:
1. Polyamide composition comprising
   a. 20–60 wt. % of a polyamide having a melting point of at least about 280° C.,
   b. 1–20 wt. % of a thermoplastic polymer having a melting point of lower than 230° C., chosen from the group formed by polyesters, copolyesters and polyamides.
   c. 5–30 wt. % of a halogen-containing organic compound which, when heated at 300° C. for 10 minutes, generates at most 200 ppm, inorganic chlorine and at most 350 ppm,
   d. 0–15 wt. % of a compound supporting the flame-retarding activity of (c),
   e. 5–50 wt. % of an inorganic reinforcement,
   f. 0–2-wt. % of other additives. and in which the sum of (a) to (f) adds up to 100 wt. %.
2. Polyamide composition according to claim 1, wherein the high-melting polyamide (a) is chosen from the group formed by polyamides built up of repeating units in the main chain derived from an aliphatic, a cycloaliphatic or an aromatic diamine and an aliphatic, a cycloaliphatic or an aromatic dicarboxylic acid or obtained through ring opening of a lactam or combinations thereof.
3. Polyamide composition according to claim 2, wherein the high-melting polyamide (a) is chosen from the group formed by aliphatic homopolyamides, aliphatic-cycloaliphatic copolyamides and aliphatic-aromatic copolyamides.
4. Polyamide composition according to claim 1, wherein the melting point of the high-melting polyamide lies between 280 and 320° C.
5. Polyamide composition according to claim 1, wherein the polymer (b) is dispersed in polyamide (a) with a particle size at which at least 90% of the particles have an average cross-section that is smaller than 3 μm, preferably smaller than 1 μm.
6. Polyamide composition according to claim 5, wherein the polyamide (b) is an aliphatic polyamide, in which the ratio of the number of aliphatic C atoms: amide groups in the chain is at least 6, preferably at least 8.
7. Polyamide composition according to claim 1, wherein the compound (c) is chosen from the group formed by halogen-containing polymers.
8. Polyamide composition according to claim 7, wherein the halogen-containing compound (c) is a bromine-containing styrene polymer.
9. Polyamide composition according to claim 1, wherein the compound (d) is chosen from the group formed by inorganic compounds.
10. Polyamide composition according to claim 9, wherein compound (d) is antimony oxide or sodium antimonate.
11. Polyamide composition according to claim 1, wherein at least a compound that contains acid imide groups is present as (f).

12. Polyamide composition according to claim 11, wherein the compound containing acid imide groups is a styrene maleimide copolymer.

13. Polyamide composition according to claim 1, wherein the composition contains 23–55 wt. % of (a)

2–15 wt. % of (b)

8–25 wt. % of (c)

2–12 wt. % of (d)

10–45 wt. % of (e)

0–10 wt. % of (f) and in which the sum of (a) to (f) adds up to 100 wt. %.

14. Polyamide compositions according to claim 1, wherein said halogen-containing organic compound, when heated at 300° C. for 10 minutes, generates at most 50 ppm inorganic chlorine.

15. Polyamide composition according to claim 1, wherein said halogen-containing organic compound, when heated at 300° C. for 10 minutes, generates at most 300 ppm inorganic bromine.

16. Polyamide composition according to claim 5, wherein said average cross-section is smaller than 1 μm.

17. An electrical or electronic component comprising a composition according to claim 1.

* * * * *